(12) United States Patent
Hyde

(10) Patent No.: US 7,333,705 B2
(45) Date of Patent: Feb. 19, 2008

(54) PHOTONIC CRYSTAL ENERGY CONVERTER

(75) Inventor: Roderick A. Hyde, Livermore, CA (US)

(73) Assignee: Searete LLC, Bellevue, WA (US)

( * ) Notice: Subject to any disclaimer, the term of this patent is extended or adjusted under 35 U.S.C. 154(b) by 295 days.

(21) Appl. No.: 11/003,577

(22) Filed: Dec. 3, 2004

(65) Prior Publication Data
US 2006/0120679 A1 Jun. 8, 2006

(51) Int. Cl.
G02B 6/10 (2006.01)
G02B 6/26 (2006.01)
G02B 6/42 (2006.01)

(52) U.S. Cl. .................. 385/129; 385/31; 385/39; 385/44; 385/130; 385/131; 385/122; 385/141

(58) Field of Classification Search .............. 385/11, 385/14, 40, 31, 129, 130, 131, 132, 122, 385/141, 49, 39, 44, 140
See application file for complete search history.

(56) References Cited

U.S. PATENT DOCUMENTS

| | | | | |
|---|---|---|---|---|
| 6,470,127 B2 | 10/2002 | Voevodkin | .............. | 385/123 |
| 6,538,191 B1 | 3/2003 | MacDonald | .............. | 136/247 |
| 6,603,911 B2 | 8/2003 | Fink et al. | .............. | 385/123 |
| 6,744,960 B2 | 6/2004 | Pelka | .............. | 385/130 |
| 6,784,603 B2 | 8/2004 | Pelka et al. | .............. | 313/113 |
| 6,819,845 B2* | 11/2004 | Lee et al. | .............. | 385/122 |
| 6,928,099 B2* | 8/2005 | Ledentsov et al. | .............. | 372/97 |
| 7,123,804 B2* | 10/2006 | Baba et al. | .............. | 385/129 |
| 2003/0128922 A1* | 7/2003 | Kolodziejski et al. | ........ | 385/27 |
| 2004/0126072 A1* | 7/2004 | Lee et al. | .............. | 385/122 |
| 2005/0180680 A1* | 8/2005 | Kong | .............. | 385/14 |
| 2006/0120679 A1* | 6/2006 | Hyde | .............. | 385/129 |

OTHER PUBLICATIONS

Berkeley Lab; "An Unexpected Discovery Could Yield A Full Spectrum Solar Cell"; Reasearch News; bearing a date of Nov. 18, 2002; pp. 1-5; located at: http://www.lbl.gov/Science-Articles/Archive/MSD-full-spectrum-solar-cell.html ; printed on Dec. 3, 2004.

Divliansky, Ivan; Mayer, Theresa; Holliday, Kito S.; Crespi, Vincent H.; "Fabrication of Three-Dimensional Polymer Photonic Crystal Structures Using Single Diffraction Element Interference Lithography"; Applied Physics Letters; bearing a date of Mar. 17, 2003; vol. 82, No. 11; pp. 1667-1669.

Spectrolab; "Spectrolab Terrestrial Concentrator Solar Cell Achieves Unparalleled Solar Energy Conversion"; bearing a date of Jul. 25, 2003; pp. 1-2; located at : http://www.spectrolab.com/com/news/news-detail.asp?id=152 ; printed on Dec. 3, 2004.

* cited by examiner

Primary Examiner—Brian M. Healy

(57) ABSTRACT

A photonic crystal is configured with wavelength converting material to act as a concentrator for electromagnetic energy. The concentrator may also be configured with energy conversion devices to convert the electromagnetic energy into another form of energy.

116 Claims, 10 Drawing Sheets

FIG. 7
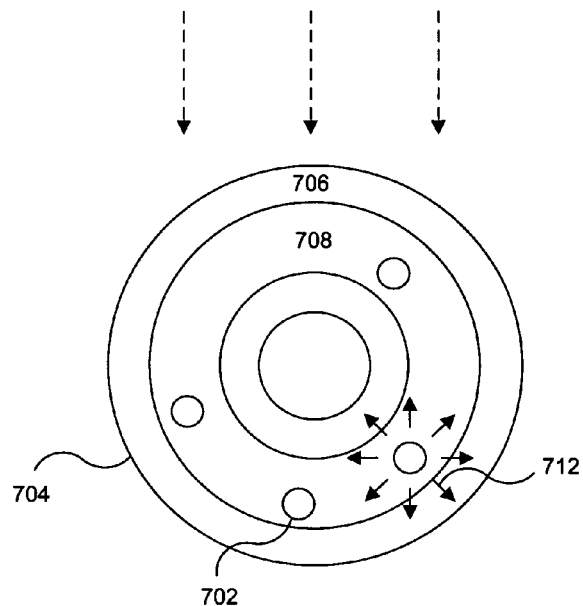
FIG. 7A
FIG. 7B
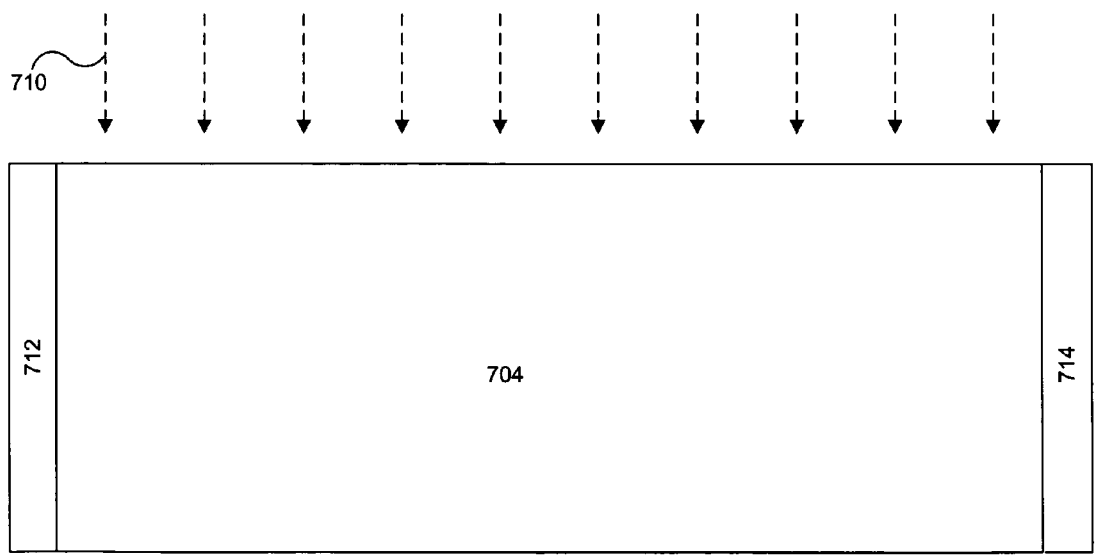

US 7,333,705 B2

PHOTONIC CRYSTAL ENERGY CONVERTER

TECHNICAL FIELD

The present application relates, in general, to photonic crystals and concentrators of electromagnetic energy.

BACKGROUND

One example of an energy conversion device having fluorescent concentrators is found in U.S. Pat. No. 6,538,191 to Stuart, entitled PHOTOCELL WITH FLUORESCENT CONVERSION LAYER, which is incorporated herein by reference. Typically, an energy conversion device having a fluorescent concentrator includes a top layer of material that is transparent to light, a bottom layer, and fluorophores that are distributed in the volume of the structure. These components, forming the fluorescent concentrator, are arranged such that light rays that are incident on the top surface of the structure reach the fluorophores. The fluorophores absorb the light and re-emit it at a different wavelength. The light rays that are emitted by the fluorophores then propagate to the edges of the fluorescent concentrator. The structure is typically large to collect a lot of light, and strips of solar cells are placed at the edges of the fluorescent concentrator and convert the fluorescence into electrical energy.

The concentrator depends on total internal reflection of the fluorescence for it to reach the edges of the fluorescent concentrator, and since the fluorescence may be absorbed and re-emitted many times by the fluorophores in the concentrator and fluorescent emission occurs at all angles with respect to the surface of the structure, this can contribute to large losses in the concentrator.

Another way of constructing a concentrator for electromagnetic energy is to use photonic band-gap materials instead of traditional dielectrics for the structure. In these materials, radiation in a certain range of frequencies does not propagate, so they transmit a wide range of frequencies (pass-band) while prohibiting other frequencies. FIG. 1 shows a band-gap diagram for a typical photonic band-gap structure. Plotted is frequency ω 102 versus wave vector k 104. For this structure there is a photonic band-gap 106 and in this range of frequencies radiation does not propagate. Light in frequency ranges above and below the band-gap 106 propagates within the photonic crystal. Photonic crystals may have more than one band-gap and pass-band.

SUMMARY

A photonic crystal may be configured with wavelength converting material (usually fluorophores) to create a concentrator. In one embodiment, the concentrator directs electromagnetic radiation to energy conversion devices. In one embodiment, the photonic crystal may be a one-dimensional photonic crystal, and may be configured as an omnidirectional multilayer reflector. In another embodiment, the photonic crystal may be configured as a waveguide, possibly with one or more energy conversion devices at one or both ends of the waveguide.

BRIEF DESCRIPTION OF THE FIGURES

FIG. 3b is a diagram showing the band-gap structure for a device such as that of FIG. 3a.

FIG. 7 is a diagram showing a cross-sectional view and a side view of a waveguide concentrator.

DETAILED DESCRIPTION

Figure 1:
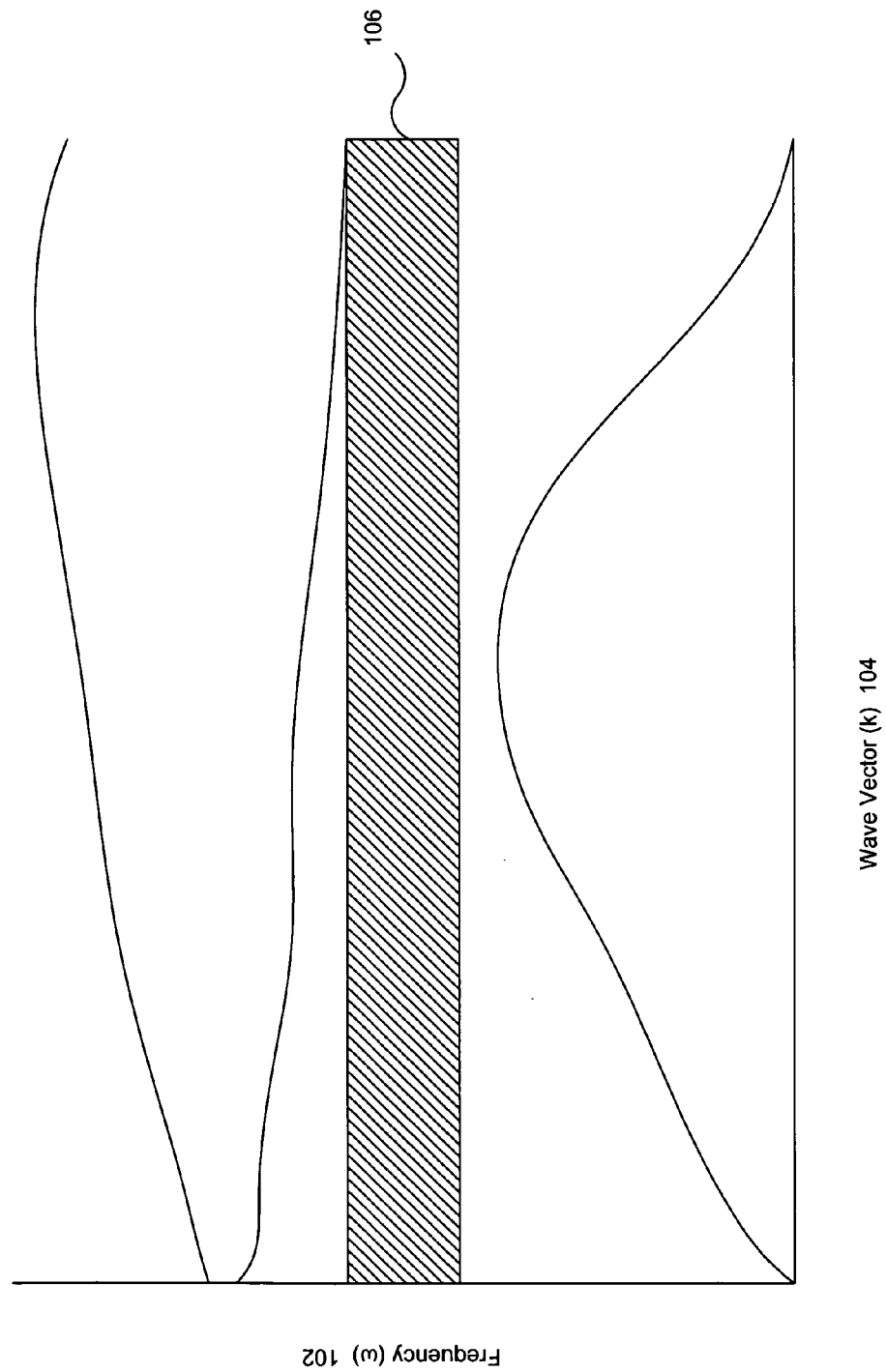
FIG. 1 is a diagram showing the band-gap structure of a typical photonic band-gap material.
Figure 2:
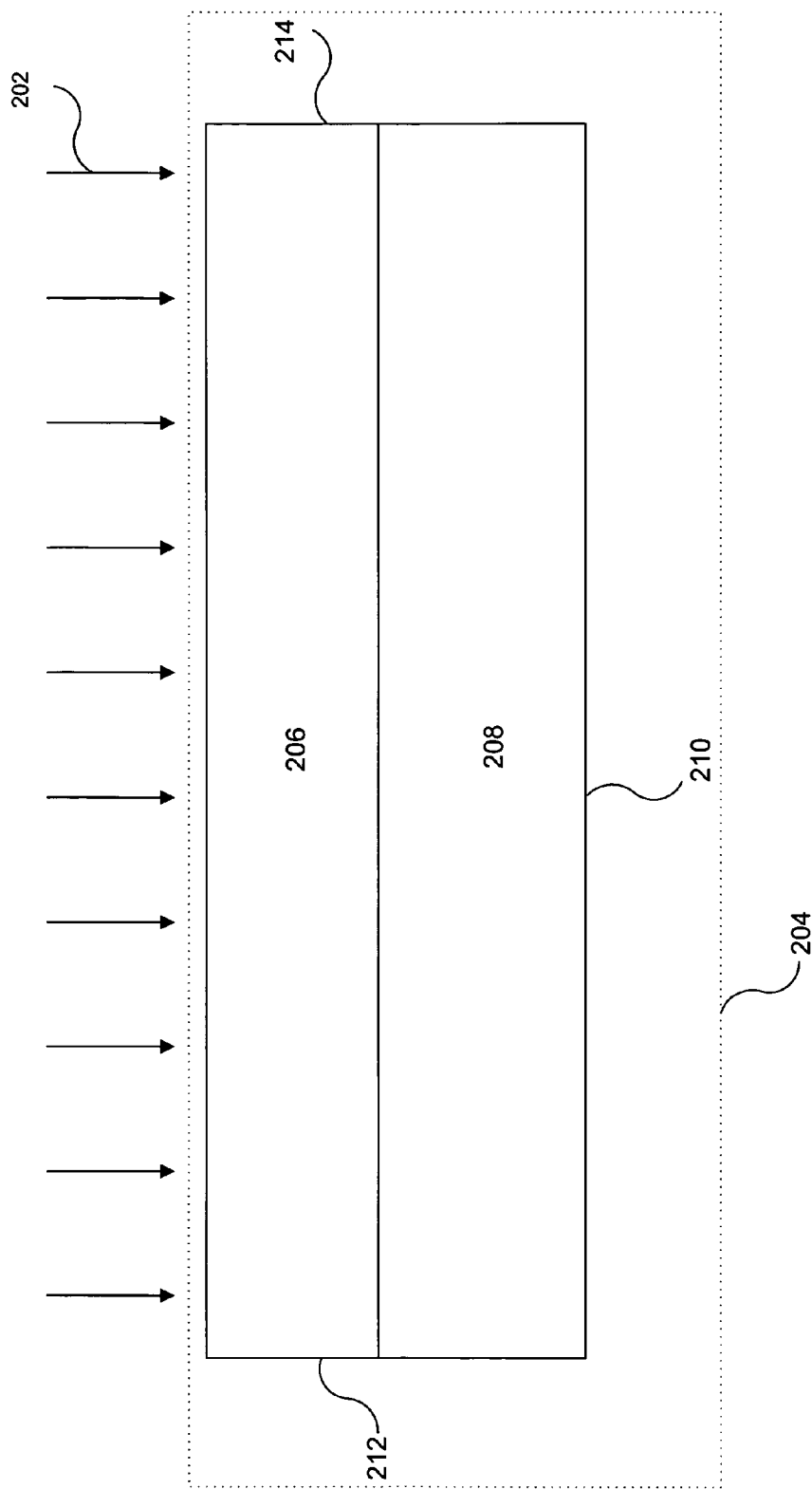
FIG. 2 is a diagram showing light rays incident on a concentrator comprising a photonic crystal and a wavelength converting material.

In an embodiment of a system, shown in FIG. 2, light 202 enters a concentrator 204. A portion of the light 202 with wavelengths outside a band-gap 106 passes through a photonic crystal segment 206 and enters a wavelength converting material 208. The photonic crystal segment may be of a photonic crystal material such as that described previously, or may be another photonic material, including a man-made material, as will be described in more detail herein.

Within the wavelength converting material 208 a portion of the light is converted to a different wavelength, for example by absorption and fluorescent re-emission. Converted photons with frequencies within the band-gap 106 are blocked by the photonic crystal segment 206 from traveling back through the photonic crystal segment 206. Converted photons can be prevented from escaping through surface 210 by a variety of methods, including a reflector, a total-internal-reflection dielectric interface, a photonic crystal material, such as material of a type similar to the material of the photonic crystal segment 206. In other approaches the photon travel may be precluded or controlled according to other types of structures, or geometries, such as to geometry of FIG. 7, rather than through a dedicated blocking surface 210. The emission photons can propagate in one or more lateral directions toward energy conversion devices at surfaces 212 or 214. The photons may be guided through waveguides, or other optical structures, or may travel free of specific waveguides.

Figure 3A:
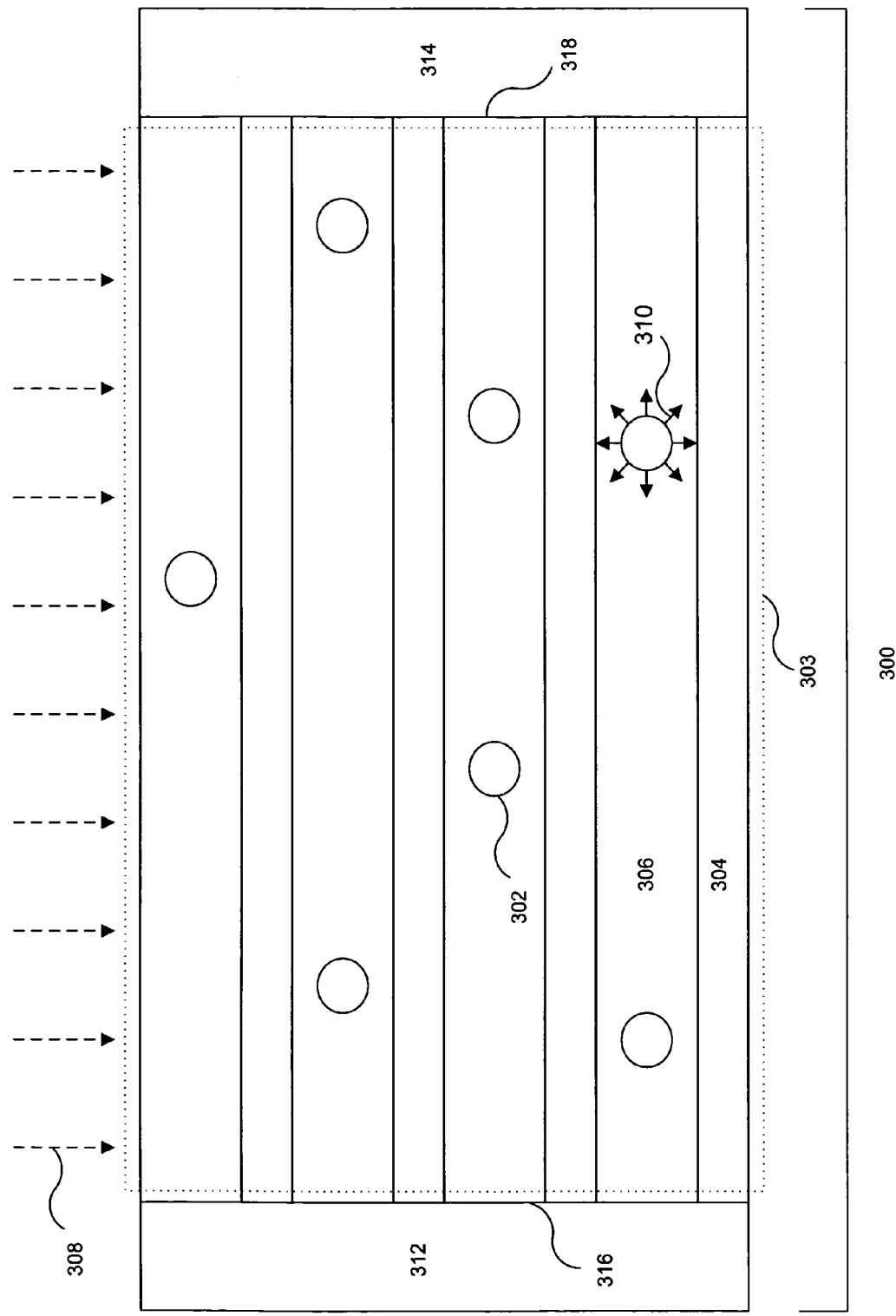
FIG. 3a is a diagram showing a cross-section of an energy conversion device with a concentrator having a multi-layered structure.
Figure 3B:
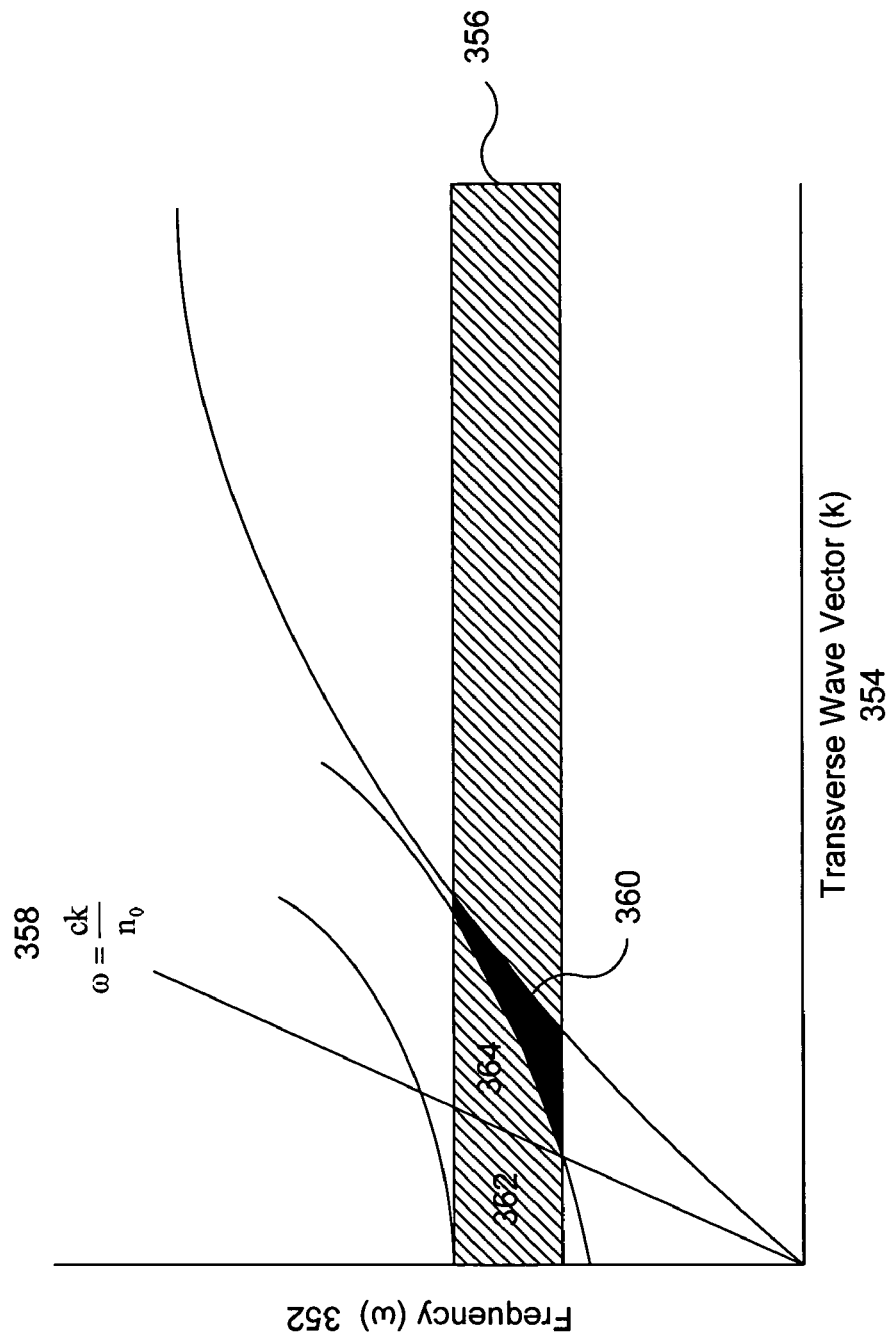

In a second embodiment, shown in FIG. 3a, wavelength converting material 302 is patterned in a multi-layered structure 303 comprising alternating layers of a first dielectric material 304 and a second dielectric material 306. The dielectric constants and thicknesses of the layers are chosen such that the multi-layered structure 303, which acts as the concentrator, forms a dielectric omnidirectional reflector, as described in Fink, Winn, Fan, Chen, Michel, Joannopoulos, and Thomas, "A Dielectric Omnidirectional Reflector", Science, Volume 282, Nov. 27, 1998, 1679, which is incorporated herein by reference. The type of photonic crystal described therein utilizes one-dimensional, multi-layer structures rather than two-dimensional or three-dimensional structures. In such photonic crystals, the band-gap 106 is generally partial, not complete; such that light with low transverse wavenumbers is blocked, but light with higher wavenumbers propagates. This band structure, illustrated in FIG. 3b, permits internal confinement, in which all light 362 that can propagate in an external environment lies within the forbidden portion of the band-gap, while some or all of light 360 with larger wavenumbers can propagate within the photonic crystal.

While the embodiment described in FIG. 2 presented a single layer photonic crystal, structures having two or more layers of photonic crystals can be utilized within a photonic crystal energy converter in the same fashion as the full-band-gap photonic crystals described in FIG. 2.

In another approach, such embodiments having two or more layers can be implemented according to a second embodiment, shown in FIG. 3a. Here, the wavelength converting material is embedded within a multilayer photonic crystal. This arrangement modifies the emission characteristics of the wavelength converting material to emit photons only in permitted portions 360 of the band-gap. The modified emission characteristics of the photons means that substantially all photons 362 that could potentially escape to and propagate in the external environment are not created. Light rays 308 incident on the multi-layered structure 303 having a frequency outside the band-gap 356 are transmitted through the multi-layered structure 303 and a portion of this light is absorbed by the wavelength converting material 302. Light 310 that is subsequently emitted by the wavelength converting material at frequencies 360 within the band-gap cannot propagate outside the multi-layered structure 303 and so travels to the edges 316, 318 where the light 310 may be converted to another form of energy by energy conversion devices 312 and 314.

Although the light 308 incident on the concentrator 303 is shown as having a direction normal to the interface, this is not a requirement and incoming radiation having any direction vector with respect to the normal of the interface may be transmitted through the concentrator 303. In some embodiments the band-gap 106 of the photonic crystal may depend on the angle that the direction vector of radiation makes with the normal to the photonic crystal interface, and in some embodiments, the band-gap may depend on the polarization of the radiation. Further, the embodiment in FIG. 3a does not require that the structure be rectilinear, and the structure may be a different shape than that shown in the figure.

The energy conversion devices 312, 314 shown in FIG. 3a, in one embodiment, may be photovoltaic cells configured to convert electromagnetic energy into electrical energy. The devices 312, 314 may include one or more photodiodes or other photoelectric devices, and the photoelectric device may be silicon-based. The device may be configured to be responsive to the full spectrum of electromagnetic energy. The device may include gallium or indium, or indium nitride. The device may be configured such that it has a plurality of junctions to receive electromagnetic energy from multiple input ports or to send energy out of multiple output ports. For a device with multiple junctions, the device may be such that each junction responds to a different central wavelength.

Figure 4:
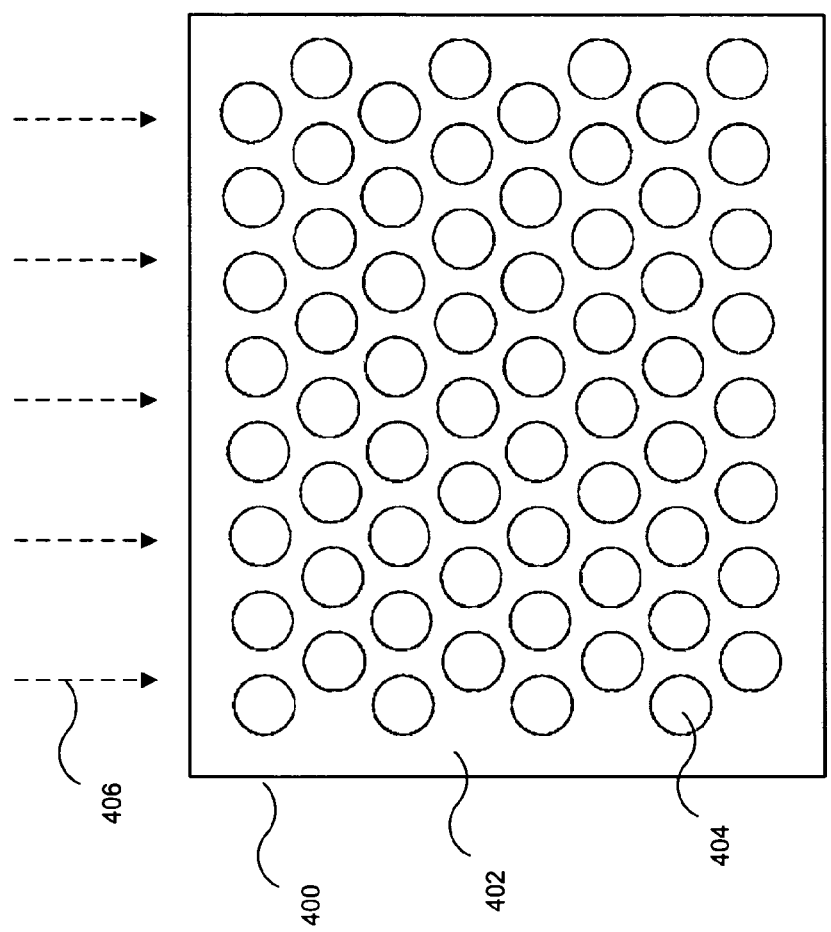
FIG. 4 is a diagram showing a photonic crystal structure.

The embodiment in FIG. 3a describes a dielectric multi-layered structure having alternating layers of a first dielectric material and a second dielectric material. In other embodiments other types of photonic crystals are possible. For example, FIG. 4 shows a cross-section of a two-dimensional photonic crystal 400 that is fabricated by patterning holes 404 in a dielectric 402. This structure has a photonic band-gap for light rays 406 propagating in the plane of the structure.

Figure 5:
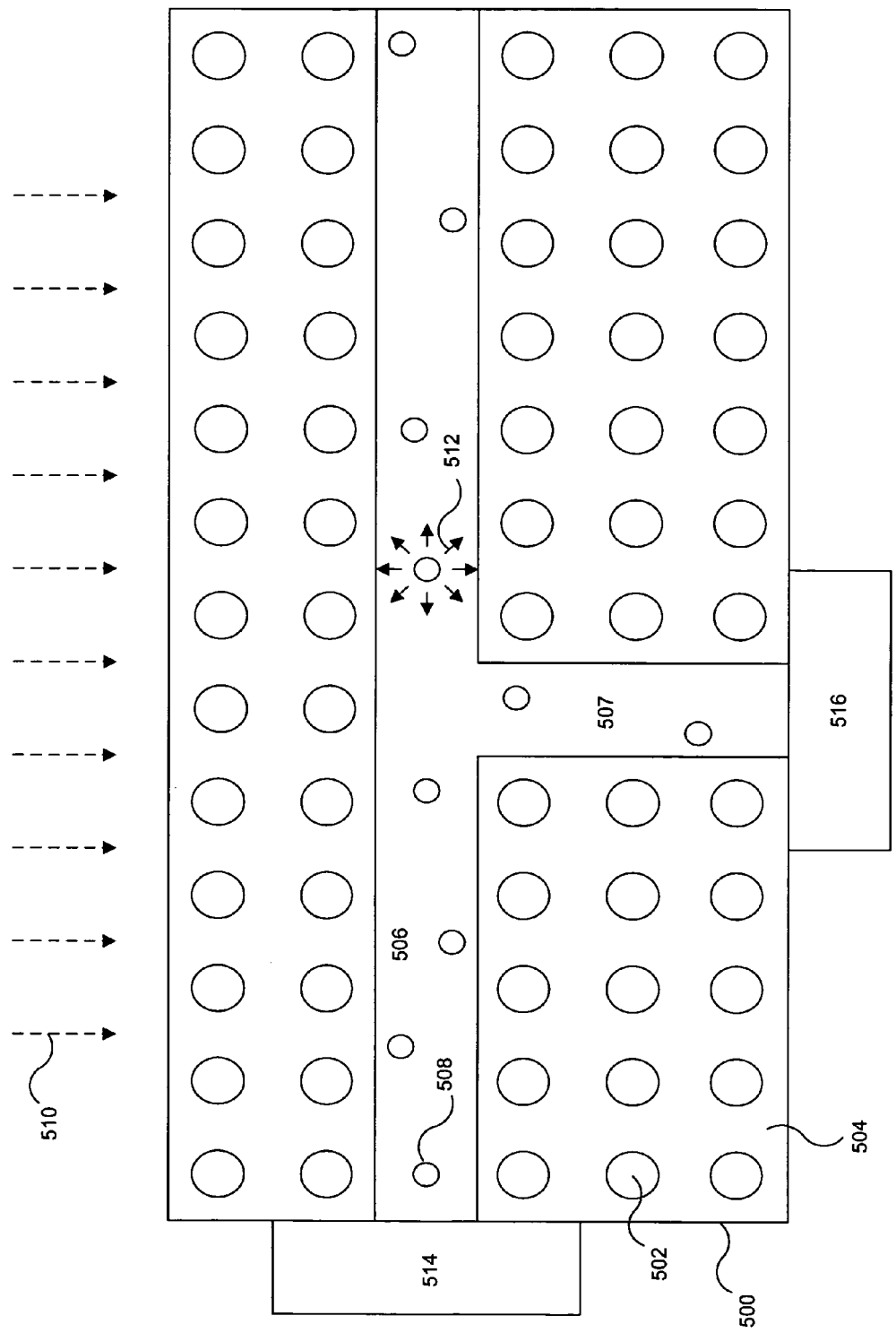
FIG. 5 is a diagram showing a photonic crystal structure having waveguides.

In the embodiment shown in FIG. 5, the photonic crystal 500 comprises holes 502 patterned in a dielectric material 504. The photonic crystal 500 is configured to have two intersecting waveguides 506 and 507 with wavelength converting material 508 in the waveguides 506 and 507. The wavelength converting material 508 absorbs incident radiation 510 and subsequently emits radiation 512 that is guided to energy conversion devices 514 and 516 by the waveguides 506 and 507. Two intersecting waveguides 506 and 507 are shown by example in FIG. 5, but the device may be configured with a different number of waveguides in a pattern different from that shown in FIG. 5 depending on the particular design. These waveguides may intersect or not, and they may meet at a common energy conversion device or they may each terminate at a different energy conversion device according to the design. Further, although FIG. 2 and FIG. 3a are shown without waveguides, any of the photonic crystal structures may incorporate one or more waveguides to facilitate the transport of electromagnetic energy.

The embodiment shown in FIG. 5 demonstrates a photonic crystal formed by patterning holes in a dielectric material. Many other ways of fabricating photonic crystals are known to those in the art, including ways of making fully three-dimensional photonic crystals having a band-gap in three dimensions. One such method is described in Divliansky, Mayer, Holliday, and Crespi, "Fabrication of three dimensional polymer photonic crystal structures using single diffraction element interference lithography", Applied Physics Letters, Volume 82, Mar. 17, 2003, 1667, which is incorporated herein by reference. Further, photonic crystals having dynamically alterable properties may be constructed by creating a photonic crystal with electro-optic and/or acousto-optic materials.

In one embodiment, fluorophores may be used as the wavelength converting material, and, specifically, quantum dots may be used as fluorophores in concentrators as described, for example, in U.S. Pat. No. 6,744,960 entitled LIGHTING APPARATUS HAVING QUANTUM DOT LAYER which is incorporated herein by reference. In another embodiment, the fluorophores may be organic fluorescent dyes. Fluorescent dyes are described in U.S. Pat. No. 6,784,603 entitled FLUORESCENT LIGHTING APPARATUS which is incorporated herein by reference. The wavelength converting material 302, 508 may be incorporated into the photonic crystal in a multitude of ways. One or more of the materials that form the photonic crystal may be doped with wavelength converting material, effectively creating a photonic crystal with a substantially even distribution of wavelength converting material throughout the material or materials that are doped. In the case of the multilayer structure shown in FIG. 3a, the wavelength converting material may be deposited between the layers. Although the embodiments described above show one kind of wavelength converting material, it is possible that other embodiments include more than one kind of wavelength converting material having different absorption and emission spectra, including different sizes of quantum dots, or a mixture of quantum dots and organic fluorescent dyes, for example. In the case of more than one kind of wavelength converting material, the wavelength converting materials may be mixed (for example, a material may be doped with two kinds of fluorophore), or the wavelength converting materials may exist in discrete sections. The wavelength converting material may be chosen such that its absorption spectrum overlaps with a selected portion of the solar spectrum.

The wavelength conversion achieved by the wavelength converting material may depend on the particular properties of the wavelength converting material. The wavelength band and the amount of electromagnetic energy absorbed and emitted by the wavelength converting material may depend on the particular material and, possibly, on the particular configuration of the wavelength converting material.

Figure 6:
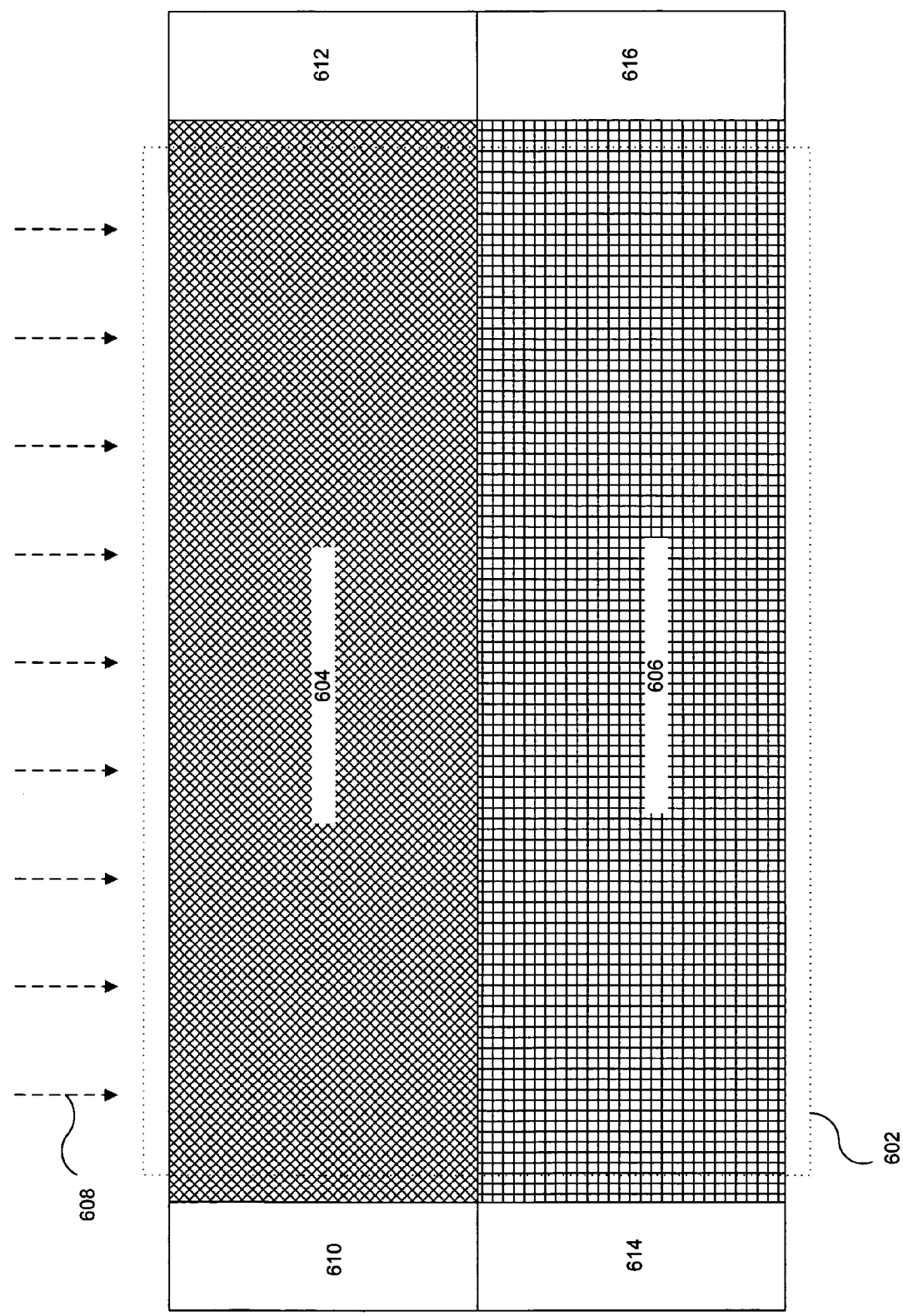
FIG. 6 is a diagram showing two different stacked photonic crystals.

In an embodiment shown in FIG. 6, the concentrator 602 includes two different stacked photonic crystals, 604 and 606. The first photonic crystal 604 is doped with wavelength converting material (not shown) having a first absorption and emission spectrum, and the second photonic crystal 606 is doped with wavelength converting material (not shown) having a second absorption and emission spectrum. Light corresponding to the first absorption spectrum passes through the first photonic crystal and a portion of this light is absorbed by the wavelength converting material in the first photonic crystal 604. Light corresponding to the second absorption spectrum passes through both the first and the second photonic crystal and is absorbed by the wavelength converting material in the second photonic crystal 606. Light that is emitted by the wavelength converting material travels to the energy conversion devices (610, 612, 614, and 616) positioned at the edge of each photonic crystal. The embodiment shown in FIG. 6 includes two different kinds of photonic crystals, however other embodiments may include three or more different photonic crystals. Each photonic crystal may or may not include wavelength converting material, and the layers may have the same or two or more different kinds of wavelength converting materials. The stacked photonic crystals need not overlap one another completely but may instead be offset by some amount. Further, although the diagram shows rectilinear photonic crystals, for some embodiments it may be preferable for the photonic crystal to be some other shape. Though the two photonic crystals are shown stacked in FIG. 6, two or more different kinds of photonic crystals may be configured side-by-side in order to capture a broader range of incident electromagnetic frequencies than could otherwise be captured with only one photonic crystal.

In another embodiment of the solar energy converter, shown in FIGS. 7a and 7b, the wavelength converting material 702 is arranged inside a radial multi-layered structure 704 comprising alternating concentric layers of a first dielectric material 706 and a second dielectric material 708. As is described in reference to FIG. 3a, the dielectric constants and thicknesses of the layers are chosen such that the radial multi-layered structure 704, which acts as the concentrator, forms a dielectric omnidirectional reflector as described in Fink. FIG. 7a shows a cross-section of the radial multi-layered structure and FIG. 7b shows a side-view of the solar energy converter having a radial multi-layered structure.

Light rays 710 incident on the radial multi-layered structure 704 having a frequency outside the band-gap 106 are transmitted through the radial multi-layered structure 704 and a portion of this light is absorbed by the wavelength converting material 702. Light 712 that is subsequently emitted by the wavelength converting material cannot propagate outside the radial multi-layered structure 704 and travels to the edges of it, where the light may be converted to another form of energy by energy conversion devices 712 and 714. Although FIG. 7b shows energy conversion devices 712 and 714 on both ends of the multi-layered structure 704, in other embodiments there may be an energy conversion device at only one end, and in other embodiments the energy conversion device may not be necessary. A radial multilayer waveguide structure is described in U.S. Pat. No. 6,603,911 entitled OMNIDIRECTIONAL MULTILAYER DEVICE FOR ENHANCED OPTICAL WAVEGUIDING which is incorporated herein by reference. However, in the patent referenced above, light is confined to the core of the multilayer device, whereas in the embodiment shown in FIGS. 7a and 7b this is not necessarily the case.

Although the embodiment described above in reference to FIGS. 7a and 7b describes a radial multilayered structure, in another embodiment the substantially concentric layers may be rectilinear in cross-section, or the cross-section may have some other shape. Further, although the embodiment described above has concentric layers, in other embodiments the layers may slightly-non concentric. FIG. 7a shows a structure having a core and three outer layers, but in other embodiments other numbers of outer layers may be desirable. The waveguide need not be a multi-layered structure but can instead be some other photonic crystal waveguide, such as the one shown in FIG. 4. A photonic band-gap fiber having fluorophores is described in U.S. Pat. No. 6,470,127 entitled PHOTONIC BAND-GAP LIGHT-EMITTING FIBERS which is incorporated herein by reference.

Figure 8:
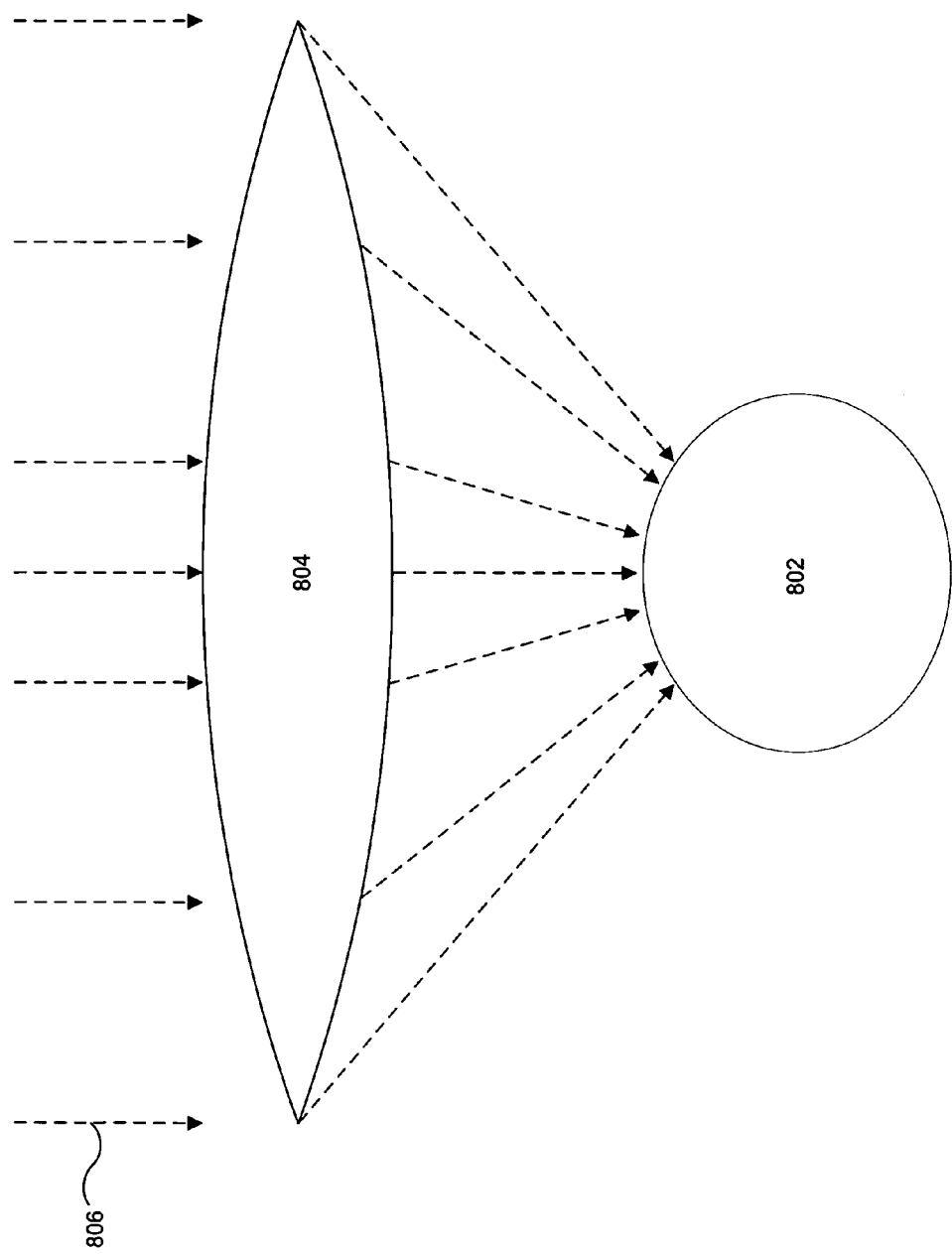
FIG. 8 is a diagram showing a cross-section of a waveguide concentrator with lens for focusing light to the waveguide.

In another embodiment, shown in FIG. 8, the waveguide 802 may include a lens 804 for focusing light 806 onto the waveguide 802. In other embodiments, the element that directs light onto the waveguide may be a mirror or a diffractive element. The embodiment in FIG. 8 shows one waveguide and one lens as an exemplary embodiment, but one skilled in the art could readily extend the configuration in FIG. 8 to more than one waveguide and/or more than one device for directing light onto the waveguide or waveguides.

Figure 9:
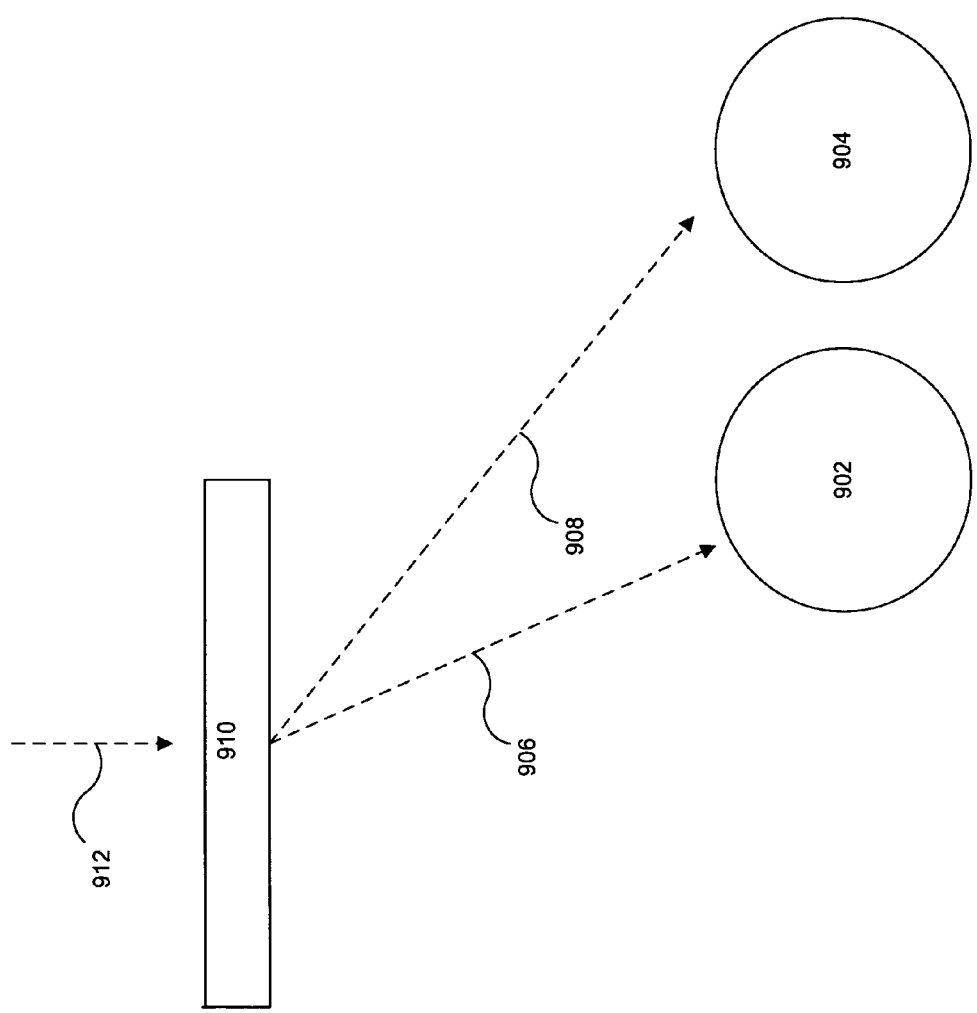
FIG. 9 is a diagram showing a diffractive element directing light rays to two waveguides.

In the case of a diffractive element, shown in FIG. 9, a first waveguide 902 and a second waveguide 904, each waveguide having wavelength converting material with different absorption spectra, may be positioned such that the light incident on each waveguide, 906 and 908, have frequencies that overlap with the absorption spectrum of the wavelength converting material in the waveguides. The diffractive element 910 diffracts light of different wavelengths at different angles relative to the element and the waveguides 902 and 904 are positioned with respect to the diffractive element such that light incident on each waveguide overlaps with the absorption spectrum of the wavelength converting material in the waveguides. The embodiment may be extended to include more than two waveguides and other elements such as lenses, mirrors, or other optical elements for directing the electromagnetic energy to the waveguides.

The embodiments above describe devices having energy conversion devices on two sides of the concentrator. However, in some cases it may be desirable to have energy conversion devices completely surrounding the concentrator, and in other cases it may be desirable to have some other configuration of energy conversion devices relative to the concentrator. The output surface(s) of the concentrators may incorporate energy conversion devices (such as photocells) to generate electricity, or may utilize the energy in photonic form (e.g., for illumination or other applications).

While the exemplary embodiments of FIGS. 1-9 are presented with reference to optical systems and terminology, those skilled in the art will recognize that at least a portion of the devices and/or processes described herein can apply to other types of systems, including UV, IR, RF, X-ray, or other electromagnetic elements, processes, or systems.

The foregoing detailed description has set forth various embodiments of the devices and/or processes via the use of block diagrams, diagrammatic representations, and examples. Insofar as such block diagrams, diagrammatic representations, and examples contain one or more functions and/or operations, it will be understood as notorious by those within the art that each function and/or operation within such block diagrams, diagrammatic representations, or examples can be implemented, individually and/or collectively, by a wide range of hardware, materials, components, or virtually any combination thereof.

Those skilled in the art will recognize that it is common within the art to describe devices and/or processes in the fashion set forth herein, and thereafter use standard engineering practices to integrate such described devices and/or processes into elements, processes or systems. That is, at least a portion of the devices and/or processes described herein can be integrated into an optical, RF, X-ray, or other electromagnetic elements, processes or systems via a reasonable amount of experimentation.

Those having skill in the art will recognize that a typical optical system generally includes one or more of a system housing or support, and may include electrical components, alignment features, one or more interaction devices, such as a touch pad or screen, control systems including feedback loops and control motors (e.g., feedback for sensing lens position and/or velocity; control motors for moving/distorting lenses to give desired focuses). Such systems may include image processing systems, image capture systems, photolithographic systems, scanning systems, or other systems employing optical, RF, X-ray or other focusing or refracting elements or processes.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

The invention claimed is:

1. An apparatus comprising:
   a first layer, the first layer including a first set of sub-elements arranged to form a first photonic crystal material, the sub-elements being configured to pass electromagnetic energy in a first wavelength band and to block electromagnetic energy in a second wavelength band;
   said first layer further including a first region containing a first wavelength converting material, the first wavelength converting material being of a type that converts energy from the first wavelength band to the second wavelength band; and
   wherein the first layer is configured to direct electromagnetic energy in the second wavelength band from the first region to one or more output locations separate from the first region.

2. The apparatus of claim 1, each of said electromagnetic energy in the first wavelength band and electromagnetic energy in the second wavelength band having a respective direction vector with respect to the normal of the first layer, and wherein the first layer is configured to pass electromagnetic energy having a first range of direction vectors and to block electromagnetic energy having a second range of direction vectors.

3. The apparatus of claim 2 wherein the first layer is oriented to block electromagnetic energy in the second wavelength band from traveling along the direction vector of the electromagnetic energy in the first wavelength band.

4. The apparatus of claim 1, said electromagnetic energy having a polarization, wherein the first layer is configured to pass electromagnetic energy having a first polarization and to block electromagnetic energy having a second polarization.

5. The apparatus of claim 1 wherein the first photonic crystal material is configured to cause the first wavelength converting material to convert energy from the first wavelength band into a third wavelength band, said third wavelength band being substantially within the second wavelength band.

6. The apparatus of claim 5 wherein energy in the third wavelength band is substantially confined to the photonic crystal material.

7. The apparatus of claim 1 wherein the first layer includes an input face configured to receive an optical beam.

8. The apparatus of claim 1 wherein the first set of sub-elements includes a matrix arrangement.

9. The apparatus of claim 1 wherein the first layer further includes a waveguide aligned to receive energy from the first region and configured to direct the received energy to the one or more locations separate from the first region.

10. The apparatus of claim 1 wherein the first layer further includes a plurality of waveguides, each aligned to receive energy from the first region and configured to direct the received energy to a respective set of the one or more locations separate from the first region.

11. The apparatus of claim 10 wherein the plurality of waveguides are configured to direct the received energy to a common one of the one or more locations separate from the first region.

12. The apparatus of claim 1 wherein a first group of sub-elements in the first set of sub-elements form a first sub-layer and a second group of sub-elements in the first set of sub-elements form a second sub-layer different from the first sub-layer.

13. The apparatus of claim 12 wherein the first sub-layer comprises a first dielectric material and the second sub-layer comprises a second dielectric material.

14. The apparatus of claim 12 wherein the first group of sub-elements in the first set of sub-elements form a third sub-layer and wherein the second group of sub-elements in the first set of sub-elements form a fourth sub-layer.

15. The apparatus of claim 14 wherein the first group of sub-elements in the first set of sub-elements and the second group of sub-elements in the first set of sub-elements form a multilayer structure having alternating sub-layers of the first group of sub-elements and the second group of sub-elements.

16. The apparatus of claim 15 wherein the multilayer structure comprises alternating layers of a first dielectric material sub-layer and a second dielectric material sub-layer.

17. The apparatus of claim 13 wherein the first dielectric material sub-layer has a first thickness and a first dielectric constant and the second dielectric material sub-layer has a second thickness and a second dielectric constant different from the first dielectric constant.

18. The apparatus of claim 17 wherein the first thickness, first dielectric constant, second thickness, second dielectric constant, and total number of sub-layers are chosen such that the first photonic crystal material guides electromagnetic energy within the second wavelength band.

19. The apparatus of claim 18 wherein the first photonic crystal material guides electromagnetic energy within the second wavelength band in a direction parallel to the interfaces between sub-layers.

20. The apparatus of claim 12 wherein the first layer further includes a waveguide extending from the first region to the one or more locations separate from the first region.

21. The apparatus of claim 20 wherein the waveguide is configured to guide electromagnetic radiation in the second wavelength band.

22. The apparatus of claim 12 wherein the first layer further includes a plurality of waveguides extending from the first region to the one or more locations separate from the first region.

23. The apparatus of claim 22 wherein one or more of the plurality of waveguides is configured to guide electromagnetic radiation in the second wavelength band.

24. The apparatus of claim 22 wherein two or more of the plurality of waveguides extend to a common one of the one or more locations separate from the first region.

25. The apparatus of claim 12 wherein the first region overlaps the first sub-layer.

26. The apparatus of claim 1 further including a second region containing a second wavelength converting material that converts energy from a third wavelength band to a fourth wavelength band.

27. The apparatus of claim 26 wherein the second wavelength converting material is different from the first wavelength converting material.

28. The apparatus of claim 26 wherein the first region is different from the second region.

29. The apparatus of claim 26 wherein the second region and the first region are both at least partially within the first layer.

30. The apparatus of claim 26 wherein the third wavelength band overlaps at least in part with the first wavelength band.

31. The apparatus of claim 30 wherein the fourth wavelength band overlaps at least in part with the second wavelength band.

32. The apparatus of claim 26 wherein the set of sub-elements are further structured to pass electromagnetic energy in a fifth wavelength band and to block electromagnetic energy in a sixth wavelength band.

33. The apparatus of claim 1, further comprising:
a second layer oriented substantially adjacent to the first layer, the second layer including a second set of sub-elements arranged to form a second photonic crystal, the second photonic crystal being structured to pass electromagnetic energy in a pass wavelength band and to block electromagnetic energy in a block wavelength band, the second layer further including a second region containing a second wavelength converting material that converts energy from the pass wavelength band to the block wavelength band.

34. The apparatus of claim 33 wherein the second layer is configured to direct electromagnetic energy in the block wavelength band to one or more output locations separate from the second region.

35. The apparatus of claim 33 wherein the pass and first wavelength bands overlap.

36. The apparatus of claim 33 wherein the second set of sub-elements is different from the first set of sub-elements.

37. The apparatus of claim 33 wherein the second wavelength converting material is different from the first wavelength converting material.

38. The apparatus of claim 33 wherein at least one of the output locations separate from the first region is the same location as at least one of the output locations separate from the second region.

39. The apparatus of claim 1 further including an energy conversion device positioned to receive electromagnetic energy from the output location.

40. The apparatus of claim 39 wherein the energy conversion device converts electromagnetic energy in the second wavelength band to electrical energy.

41. The apparatus of claim 39 wherein the energy conversion device includes a photodiode.

42. The apparatus of claim 39 wherein the energy conversion device includes a photoelectric device.

43. The apparatus of claim 42 wherein the photoelectric device is silicon based.

44. The apparatus of claim 39 wherein the energy conversion device includes a substantially full spectrum response.

45. The apparatus of claim 39 wherein the energy conversion device includes gallium or indium.

46. The apparatus of claim 39 wherein the energy conversion device includes indium nitride.

47. The apparatus of claim 39 wherein the energy conversion device includes a plurality of junctions.

48. An apparatus comprising:
a first layer, the first layer including a first set of sub-elements arranged to form a first photonic crystal material, the sub-elements being configured to pass electromagnetic energy in a first wavelength band and to block electromagnetic energy in a second wavelength band;
said first layer further including a first region containing a first wavelength converting material, the first wavelength converting material being of a type that converts energy from the first wavelength band to the second wavelength band;
wherein the first layer is configured to direct electromagnetic energy in the second wavelength band from the first region to one or more output locations separate from the first region;

further including an energy conversion device positioned to receive electromagnetic energy from the output location;
wherein the energy conversion device includes a plurality of junctions; and
wherein each of the junctions in the plurality of junctions includes a respective central wavelength, and wherein a first of the central wavelengths is different from a second of the central wavelengths.

49. An apparatus comprising:
a first layer, the first layer including a first set of sub-elements arranged to form a first photonic crystal material, the sub-elements being configured to pass electromagnetic energy in a first wavelength band and to block electromagnetic energy in a second wavelength band;
said first layer further including a first region containing a first wavelength converting material, the first wavelength converting material being of a type that converts energy from the first wavelength band to the second wavelength band;
wherein the first layer is configured to direct electromagnetic energy in the second wavelength band from the first region to one or more output locations separate from the first region;
further including an energy conversion device positioned to receive electromagnetic energy from the output location; and
wherein the energy conversion device includes at least three junctions.

50. The apparatus of claim 49 wherein each of the junctions in the at least three junctions includes a respective central wavelength, and wherein each of the central wavelengths is different from at least two other central wavelengths.

51. An apparatus comprising:
a first layer, the first layer including a first set of sub-elements arranged to form a first photonic crystal material, the sub-elements being configured to pass electromagnetic energy in a first wavelength band and to block electromagnetic energy in a second wavelength band;
said first layer further including a first region containing a first wavelength converting material, the first wavelength converting material being of a type that converts energy from the first wavelength band to the second wavelength band;
wherein the first layer is configured to direct electromagnetic energy in the second wavelength band from the first region to one or more output locations separate from the first region; and
wherein the first wavelength band passed by the first layer overlaps at least in part with the solar spectrum.

52. An apparatus comprising:
a first layer, the first layer including a first set of sub-elements arranged to form a first photonic crystal material, the sub-elements being configured to pass electromagnetic energy in a first wavelength band and to block electromagnetic energy in a second wavelength band;
said first layer further including a first region containing a first wavelength converting material, the first wavelength converting material being of a type that converts energy from the first wavelength band to the second wavelength band;
wherein the first layer is configured to direct electromagnetic energy in the second wavelength band from the first region to one or more output locations separate from the first region; and
wherein the first wavelength converting material includes one or more fluorophores.

53. The apparatus of claim 52 wherein the one or more fluorophores include one or more quantum dots.

54. The apparatus of claim 52 wherein the one or more fluorophores include one or more organic fluorescent dyes.

55. The apparatus of claim 1 wherein the first layer includes one or more electro-optic materials.

56. The apparatus of claim 55 wherein the set of sub-elements forms at least a portion of the one or more electro-optic materials.

57. The apparatus of claim 1 wherein the first layer includes one or more acousto-optic materials.

58. The apparatus of claim 57 wherein the set of sub-elements forms at least a portion of the one or more acousto-optic materials.

59. An apparatus, comprising:
a photonic crystal structure, said photonic crystal structure further including a photonic crystal material and a first wavelength converting material;
an energy conversion device positioned to receive electromagnetic energy from the first wavelength converting material;
wherein the photonic crystal is structured to pass electromagnetic energy in a first wavelength band and to block electromagnetic energy in a second wavelength band; and
wherein the first wavelength band passed by the photonic crystal overlaps at least in part with the solar spectrum.

60. The apparatus of claim 59, the photonic crystal being structured to pass electromagnetic energy in a first wavelength band and to block electromagnetic energy in a second wavelength band.

61. The apparatus of claim 60 wherein the first wavelength converting material is within a first region of the photonic crystal structure.

62. The apparatus of claim 61 wherein the first wavelength converting material is of a type that converts energy from the first wavelength band to the second wavelength band.

63. The apparatus of claim 62 wherein the photonic crystal structure is configured to direct electromagnetic energy in the second wavelength band to one or more output locations separate from the first region.

64. The apparatus of claim 59 wherein the photonic crystal structure is substantially planar having parallel faces.

65. The apparatus of claim 64 wherein the photonic crystal comprises a first sub-layer and a second sub-layer.

66. The apparatus of claim 65 wherein the first sub-layer comprises a first dielectric material and the second sub-layer comprises a second dielectric material.

67. The apparatus of claim 66 wherein the first dielectric sub-layer has a first thickness and a first dielectric constant and the second dielectric sub-layer has a second thickness and a second dielectric constant.

68. An apparatus, comprising:
a photonic crystal structure, said photonic crystal structure further including a photonic crystal material and a first wavelength converting material;
an energy conversion device positioned to receive electromagnetic energy from the first wavelength converting material;

wherein the photonic crystal structure is substantially planar having parallel faces;
wherein the photonic crystal comprises a first sub-layer and a second sub-layer;
wherein the first sub-layer comprises a first dielectric material and the second sub-layer comprises a second dielectric material;
wherein the first dielectric sub-layer has a first thickness and a first dielectric constant and the second dielectric sub-layer has a second thickness and a second dielectric constant; and
wherein the first thickness, first dielectric constant, second thickness, second dielectric constant, and total number of sub-layers are chosen to block more than 95% of electromagnetic energy within the second wavelength band.

69. An apparatus, comprising:
a photonic crystal structure, said photonic crystal structure further including a photonic crystal material and a first wavelength converting material;
an energy conversion device positioned to receive electromagnetic energy from the first wavelength converting material;
wherein the photonic crystal structure is substantially planar having parallel faces;
wherein the photonic crystal comprises a first sub-layer and a second sub-layer;
wherein the first sub-layer comprises a first dielectric material and the second sub-layer comprises a second dielectric material;
wherein the first dielectric sub-layer has a first thickness and a first dielectric constant and the second dielectric sub-layer has a second thickness and a second dielectric constant; and
wherein the first thickness, first dielectric constant, second thickness, second dielectric constant, and total number of sub-layers are chosen to pass less than 5% of electromagnetic energy within the second wavelength band.

70. The apparatus of claim 66 wherein the photonic crystal further includes a multilayer structure, said multilayer structure having at least two alternating layers of the first dielectric material and the second dielectric material.

71. The apparatus of claim 59 wherein the photonic crystal structure further includes a waveguide extending from a first region including the first wavelength converting material to one or more locations separate from the first region.

72. The apparatus of claim 59 wherein the photonic crystal structure further includes a plurality of waveguides extending from a first region including the first wavelength converting material to one or more locations separate from the first region.

73. The apparatus of claim 72 wherein two or more of the plurality of waveguides are configured to join at least one of the locations separate from the first region.

74. The apparatus of claim 59 wherein a region of the photonic crystal structure forms a first waveguide.

75. The apparatus of claim 74 wherein the photonic crystal further includes a multilayer structure that forms the first waveguide, the multilayer structure having at least two alternating layers of a first dielectric material and a second dielectric material.

76. The apparatus of claim 75 wherein the first waveguide is a substantially planar waveguide.

77. The apparatus of claim 74 wherein the first waveguide is bounded on at least three sides.

78. The apparatus of claim 74 wherein the first waveguide includes an inner core region and at least one outer region, the inner core region comprising a core dielectric material and the at least one outer region comprising a cladding dielectric material, wherein the at least one outer regions surround the inner core region.

79. The apparatus of claim 78 wherein the inner core region has a first characteristic dimension.

80. The apparatus of claim 79 wherein the first characteristic dimension is a radius.

81. The apparatus of claim 79, the first waveguide being structured to pass electromagnetic energy in a first wavelength band and to block electromagnetic energy in a second wavelength band.

82. The apparatus of claim 81 wherein the photonic crystal is further structured to pass electromagnetic energy in a third wavelength band and to block electromagnetic energy in a fourth wavelength band.

83. The apparatus of claim 81 wherein the first wavelength converting material is of a type that converts energy from the first wavelength band to the second wavelength band.

84. An apparatus, comprising:
a photonic crystal structure, said photonic crystal structure further including a photonic crystal material and a first wavelength converting material;
an energy conversion device positioned to receive electromagnetic energy from the first wavelength converting material;
wherein a region of the photonic crystal structure forms a first waveguide;
wherein the first waveguide includes an inner core region and at least one outer region, the inner core region comprising a core dielectric material and the at least one outer region comprising a cladding dielectric material, wherein the at least one outer regions surround the inner core region;
wherein the inner core region has a first characteristic dimension;
the first waveguide being structured to pass electromagnetic energy in a first wavelength band and to block electromagnetic energy in a second wavelength band;
wherein the first wavelength converting material is of a type that converts energy from the first wavelength band to the second wavelength band; and
wherein the first characteristic dimension, core dielectric constant, cladding dielectric material, and dielectric constant of the cladding material define a structure that blocks more than 95% of electromagnetic energy within the second wavelength band.

85. The apparatus of claim 74 further including a device for directing radiation, wherein said device is configured to direct radiation onto the first waveguide.

86. The apparatus of claim 85 wherein the device for directing radiation onto the first waveguide is a lens.

87. The apparatus of claim 85 wherein the device for directing radiation onto the first waveguide is a mirror.

88. The apparatus of claim 85 wherein the device for directing radiation onto the first waveguide is a diffractive element.

89. The apparatus of claim 85 wherein the first wavelength converting material is of a type that converts energy from a first wavelength band to a second wavelength band.

90. The apparatus of claim 89 wherein the first waveguide is oriented relative to the device for directing radiation such that said device couples light in the first wavelength band into the first waveguide.

91. The apparatus of claim 90 further comprising a second photonic crystal, said second photonic crystal including a second wavelength converting material, said second wavelength converting material being of a type that converts energy from a third wavelength band to a fourth wavelength band.

92. The apparatus of claim 91 wherein the second waveguide is oriented relative to the device for directing radiation such that said device couples light in the third wavelength band into the second waveguide.

93. The apparatus of claim 92 wherein the device for directing radiation is a diffractive element.

94. The apparatus of claim 91 further including a second energy conversion device positioned to receive electromagnetic energy from the second wavelength converting material.

95. The apparatus of claim 59 wherein the first wavelength converting material is within a first region of the photonic crystal structure, and wherein the first wavelength converting material is of a type that converts energy from a first portion of a first wavelength band to a second wavelength band, further including a second wavelength converting material within a second region of the photonic crystal structure that converts energy from a second portion of the first wavelength band to a third wavelength band.

96. The apparatus of claim 95 wherein the first region is different from the second region.

97. The apparatus of claim 95 wherein the third wavelength band overlaps at least in part with the second wavelength band.

98. The apparatus of claim 95 wherein the photonic crystal structure is structured to confine light in the second and third wavelength bands.

99. The apparatus of claim 98 wherein the photonic crystal structure is structured to confine light in the second wavelength band in a first confined region and light of the third wavelength band in a second confined region.

100. The apparatus of claim 99 wherein the first and second confined regions are different regions.

101. The apparatus of claim 99 wherein the first and second confined regions are overlapping regions.

102. An apparatus, comprising:
a photonic crystal structure, said photonic crystal structure further including a photonic crystal material and a first wavelength converting material;
an energy conversion device positioned to receive electromagnetic energy from the first wavelength converting material; and
wherein the first wavelength converting material comprises one or more fluorophores.

103. The apparatus of claim 102 wherein the one or more fluorophores comprise one or more quantum dots.

104. The apparatus of claim 102 wherein the one or more fluorophores comprise one or more organic fluorescent dyes.

105. The apparatus of claim 59 further including an electro-optic material positioned to interact with the photonic crystal structure.

106. The apparatus of claim 59 wherein the photonic crystal is electro-optic.

107. The apparatus of claim 59 further including an acousto-optic material positioned to interact with the photonic crystal structure.

108. An apparatus, comprising:
a selector region having a first photonic bandgap structure;
a trapping region having a second photonic bandgap structure;
a conversion region within the trapping region;
a converting device coupled to the conversion region;
wherein the selector region is defined by a man-made material;
wherein the selector region comprises a multilayer structure, said multilayer structure comprising at least two alternating layers of a first dielectric material and a second dielectric material different from the first dielectric material;
wherein the first dielectric layer has a first thickness and a first dielectric constant and the second dielectric layer has a second thickness and a second dielectric constant different from the first dielectric constant;
wherein the first thickness, first dielectric constant, second thickness, second dielectric constant, and total number of layers are chosen to pass substantially all of the electromagnetic energy within a first wavelength band through the selector region and to block substantially all of the electromagnetic energy within a second wavelength band from entering the selector region; and
wherein the conversion region is configured to convert electromagnetic energy in the first wavelength band to electromagnetic energy in the second wavelength band.

109. The apparatus of claim 108 wherein the trapping region traps electromagnetic energy in the second wavelength band.

110. The apparatus of claim 109 wherein the trapping region is configured to guide electromagnetic energy in the second wavelength band to the convening device.

111. A method for:
passing electromagnetic energy in a first wavelength band into a first region and blocking electromagnetic energy in a second wavelength band from entering the first region;
converting electromagnetic energy in the first wavelength band to electromagnetic energy in the second wavelength band within said first region;
trapping substantially all electromagnetic energy in the second wavelength band within said first region; and
directing electromagnetic energy in the second wavelength band to one or more locations outside of said first region.

112. The method of claim 111 further comprising converting electromagnetic energy in the second wavelength band to another form of energy.

113. The method of claim 111 further comprising dynamically changing the first wavelength band.

114. The method of claim 111 further comprising passing electromagnetic energy in a third wavelength band into a second region and blocking electromagnetic energy in a fourth wavelength band from entering the second region.

115. The method of claim 114 wherein the first and second regions are different regions.

116. The method of claim 111 further comprising selecting a first wavelength range from a beam of incident radiation and directing the first wavelength range to the first region.

\* \* \* \* \*

UNITED STATES PATENT AND TRADEMARK OFFICE
CERTIFICATE OF CORRECTION

PATENT NO.         : 7,333,705 B2
APPLICATION NO.    : 11/003577
DATED              : February 19, 2008
INVENTOR(S)        : Roderick A. Hyde Page 1 of 1

It is certified that error appears in the above-identified patent and that said Letters Patent is hereby corrected as shown below:

Column 16, Line 34, there is a typographical error. The word "convening" should be changed to the word --converting--.

Signed and Sealed this

Fifteenth Day of April, 2008

JON W. DUDAS
*Director of the United States Patent and Trademark Office*